United States Patent [19]

Dahlberg

[11] Patent Number: 4,468,683

[45] Date of Patent: Aug. 28, 1984

[54] HIGH POWER FIELD EFFECT TRANSISTOR

[75] Inventor: Reinhard Dahlberg, Flein, Fed. Rep. of Germany

[73] Assignee: Higratherm Electric GmbH, Heilbronn, Fed. Rep. of Germany

[21] Appl. No.: 165,111

[22] Filed: Jul. 1, 1980

[30] Foreign Application Priority Data

Jul. 3, 1979 [DE] Fed. Rep. of Germany ....... 2926741

[51] Int. Cl.³ ................... H01L 29/78; H01L 29/80; H01L 29/06
[52] U.S. Cl. ...................................... 357/23; 357/22; 357/55
[58] Field of Search ............... 357/22 G, 22 S, 22 P, 357/22 R, 23 R, 23 C, 23 HH, 45, 55, 23 VD, 15, 23 NS

[56] References Cited

U.S. PATENT DOCUMENTS

| | | | |
|---|---|---|---|
| 2,728,034 | 12/1955 | Kurshan | 357/6 |
| 2,930,950 | 3/1960 | Teszner | 357/23 VD |
| 3,274,461 | 9/1966 | Teszner | 357/22 |
| 3,363,153 | 1/1968 | Zloczower | 357/23 VD |
| 3,488,835 | 1/1970 | Becke et al. | 357/36 |
| 3,509,432 | 4/1970 | Aponick, Jr. et al. | 357/23 NS |
| 3,584,268 | 6/1971 | Schmidlin | 357/23 NS |
| 3,925,803 | 12/1975 | Kobayashi | 357/22 |
| 3,999,281 | 12/1976 | Goronkin et al. | 357/22 |
| 4,115,793 | 9/1978 | Nishizawa | 357/23 VD |

FOREIGN PATENT DOCUMENTS

| | | |
|---|---|---|
| 1080696 | 4/1960 | Fed. Rep. of Germany . |
| 1207015 | 12/1965 | Fed. Rep. of Germany . |
| 2335503 | 1/1974 | Fed. Rep. of Germany . |
| 2547262 | 4/1977 | Fed. Rep. of Germany . |

OTHER PUBLICATIONS

S. Schaefer, "Herstellung von P-N-Ueberganengen Durch Gemeinsame Plastisch Verformung von P- und N-Dotiertem Germanium", *Solid-State Electronics*, vol. 11, (1968) pp. 675-681.

Primary Examiner—Andrew J. James
Assistant Examiner—J. Carroll
Attorney, Agent, or Firm—Spencer & Frank

[57] ABSTRACT

A field effect transistor comprises two semiconductor plates, discs or chips of the same type of conducitivity each with a structure of parallel ridges on one side, the two plates, discs or chips being assembled together under mechanical pressure with their structured sides facing and relatively rotated so that the ridges of one plate, disc or chips touch and cross the ridges of the other plate, disc or chip and form distribution of electrically parallel connected monocrystalline narrow path resistors, and a gate contact for each narrow path resistor. The invention also includes a method of making such a transistor.

9 Claims, 5 Drawing Figures

HIGH POWER FIELD EFFECT TRANSISTOR

BACKGROUND OF THE INVENTION

The invention relates to a field-effect transistor having, for example, p/n, MOS or Schottky field-effect gate contacts.

Because of the high resistance (value) of the input impedances, a field-effect transistor is often preferred to the bipolar transistor for certain practical applications. There are a series of methods today by means of which field-effect transistors are produced. 'V-MOS technology' which has been developed recently makes it possible to produce field-effect transistors of particularly high power. One disadvantage of these field-effect transistors lies in the relatively high cost of manufacture.

SUMMARY OF THE INVENTION

It is an object of the invention to provide a high power field-effect transistor which has advantages in manufacture.

According to a first aspect of the invention, a field-effect transistor comprises two semicoductor plates, discs and chips of the same type of conductivity, a structure of parallel ridges on one side of each said plate, disc or chip which cross and touch when said plates, discs or chips are assembled together under mechanical pressure with their structured sides facing and relatively rotated to provide a distribution of electrically parallel connected narrow path resistors, and a gate contact for each said narrow path resistor.

Further according to this aspect of the invention there is provided a field-effect transistor, in which two semiconductor plates, discs or chips of the same type of conductivity are provided; a structure of parallel ridges is present on one side of each disc; the two discs or chips are assembled with their structured sides together under mechanical pressure so that the ridges of both discs cross and touch so that there is a distribution, in terms of area, of electrically parallel connected narrow path resistors between the two semiconductor discs; and a gate contact is provided for each narrow path resistor.

According to a second aspect of the invention a method of producing a field-effect transistor comprises forming a structure of parallel ridges on one main surface of two semiconductor plates of the same type of conductivity, assembling the said two semiconductor plates, discs or chips together with said structures facing but rotated under mechanical pressure relative to each other to provide crossing and touching of said ridges of said structure and provide a distribution of electrically parallel connected narrow path resistors, and providing a gate contact for each said narrow path resistor.

BRIEF DESCRIPTION OF THE DRAWINGS

The invention will now be described in greater detail by way of example, with reference to the drawings wherein:

FIG. 3b is a sectional view at right angles to the section of FIG. 3a.

DESCRIPTION OF THE PREFERRED EMBODIMENTS

Figure 1A:
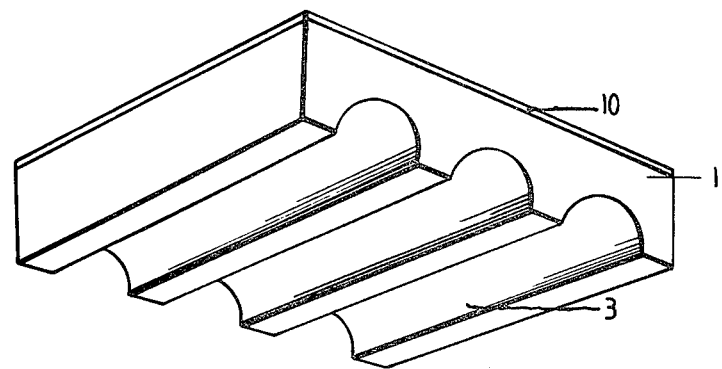
FIG. 1a is a perspective view of two plates or chips for production of an MOS-p-silicon field-effect transistor.

Basically the invention proposes that discs or chips of the same type of conductivity are provided; that a structure of parallel ridges is provided on one side of each disc; that the two discs are assembled under mechanical pressure with their structured sides facing so that the ridges of both discs cross and touch and so that there is a distribution, in terms of area, of electrically parallel connected narrow path resistors between the two semiconductor discs; and a narrow path field-effect control contact is provided for each narrow path resistor.

The principle of parallel ridges which cross has already been described in German Offenlegungsschrift No. P 25 47 262. The application of this principle to field effect transistors in not however mentioned in No. P 25 47 262.

In the field-effect transistor of the invention, a p/n-junction may be used as the field-effect control or gate contact. Furthermore, an MOS contact or a Schottky contact may form the field-effect control contact. The Schottky contact may be formed by the limit resistors by arranging a thin metal foil or a metallized insulating foil between the structures of both discs. The electrical connection of the field-effect p/n-contact or a field-effect MOS contact may take place by means of a metal foil or a metallized insulating foil which is placed between the structures of both discs. When assembling the two discs under mechanical pressure, the metal or metallized foil is forced away from the areas of contact.

The two semiconductor plates, discs or chips may have a monocrystalline structure and may be assembled at such a high temperature that the parallel limit resistors between the two semiconductor plates, discs or chips are transformed into monocrystalline limit resistors as a result of plastic deformation of the semiconductor lattice.

Monocrystalline or polycrystalline (single) -element semiconductors or compound semiconductors may be used as the material for the semiconductor plates, discs or chips.

The field-effect transistor of the invention may be used as a switch and as a power amplifier.

Referring now to the drawings, three embodiments of the invention will be described.

EMBODIMENT 1

Figure 1A:
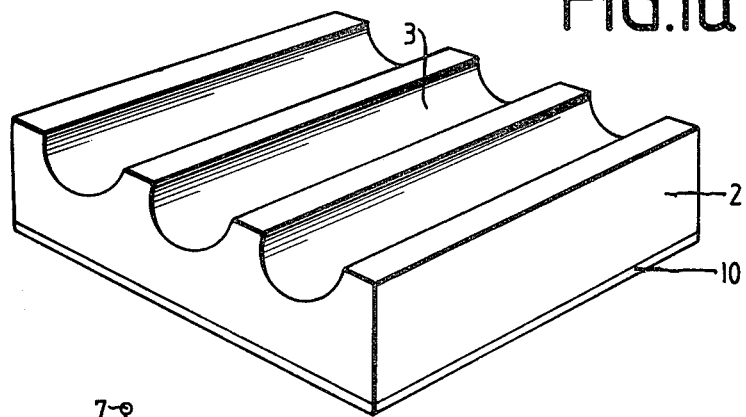
Figure 1B:
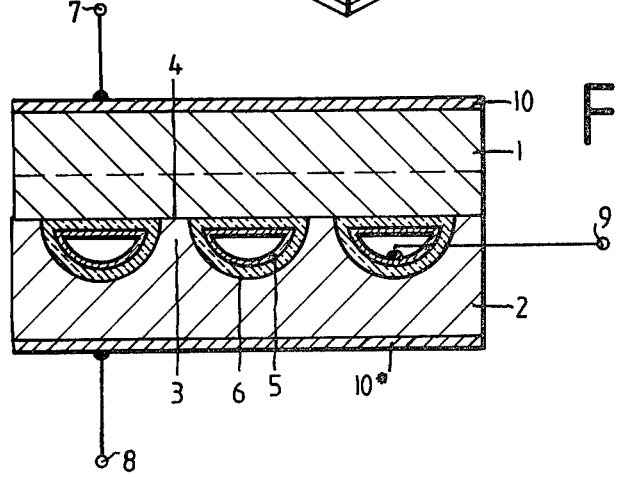
FIG. 1b is a sectional view of the completed MOS-p-silicon field-effect transistor.
Figure 2:
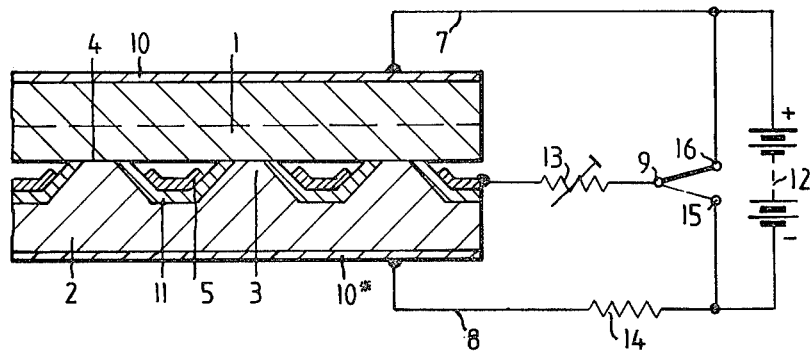
FIG. 2 is a sectional view of transistor having p/n gate contacts.

In FIG. 1, 1 and 2 are p-silicon plates having a specific electrical resistance of 100 Ωcm. One side of each disc 1 and 2 has a structure with parallel ridges 3 which taper towards the exposed outer surface to a residual width of $10^{31\,3}$ cm. The disc 1 is rotated in relation to the ridge structures by 90° with respect to disc 2 in the plane of the discs and is placed on to the disc 2 at a fixed pressure so that the ridges 3 of the two discs 1 and 2 cross and form sixteen areas of contact 4 (as shown in FIG. 1b). By heating to 900° C., the areas of contact 4 are transformed into sixteen monocrystalline narrow path resistors 4 having an area of $1.10^{-6}$ cm$^2$ and an electrical resistance of $\sim 10^5$ ohms. The exposed parts of the surfaces of the ridges 3 are subsequently coated with a thermal quartz layer or a glass layer 6. The quartz layer 6 is coated by means of electrodeless separation in a double layer of copper/gold 5 having a total thickness of $3.10^{-5}$ cm. 10 and 10* are non blocking or ohmic contacts for the plates 1 and 2 situated on the surfaces opposite the ridge structure. The drain electrode 7 and the source electrode 8 are connected to these contacts. The gate electrode 9 is connected to the copper/gold layer 5 electrically. The field-effect transistor has an electrical resistance of approximately $7.10^3$ ohms for a gate voltage of zero. With a gate voltage of approximately 5 volts, the resistance rises to approximately $10^8$ ohms.

EMBODIMENT 2

In FIG. 2, 1 and 2 are n-silicon plates with a crystal orientation of 100 and a specific resistance of 5 $\Omega$. cm. Both discs 1 and 2 have, on one side, a structure of parallel ridges 3 tapering on their outer faces to a width of $2.5.10^{-4}$ cm. The ridges 3 were produced by forming grooves in the surface of the discs by an etching process, in which the ridge was protected at its outer face by a quartz layer. This quartz layer was subsequently used as a mask during diffusion of a p+-layer 11. It was then also used as a mask for vapor deposition of a tungsten layer 5. After removing the quartz layer (tungsten vapor-deposited), the two plates 1 and 2 were joined together at their structured surfaces under pressure at 850° C. in a hydrogen atmosphere after being rotated with respect to each other by 90° in relation to the ridge structures. Thus the areas of contact 4 of the crossing ridges were transformed into monocrystalline narrow path resistors 4. The d.c. voltage source 12 of 5 volts, for example, is applied to the plate 1 via an electrical resistor 14 between the source electrode contact 10* on the plate 2 and the drain electrode contact 10 on the plate 1. The gate electrode 9 is connected electrically to the tungsten layer 5 on the p+-layer 11 via the variable resistor 13. In the switch position 15, in which the gate electrode 9 is connected to negative potential, a negative voltage of, say, 5 volts is applied to the tungsten layers 5 and thus to the p+-layer 11, the narrow path resistors 4 being made very high in resistance by this negative voltage as a result of the space charge regions of the p/n-junctions 11/2. In the switch position 16, in which the gate electrode 9 is connected to positive potential, a positive voltage is however applied to the p+-layers 11, and the p/n-junctions 11/2 and 11/1 are poled in the flow direction. This low-resistance condition of the narrow path resistors takes place if the gate eletrode 9 and thus the p+-layers 11 are at flow potential.

EMBODIMENT 3

Figure 3A:
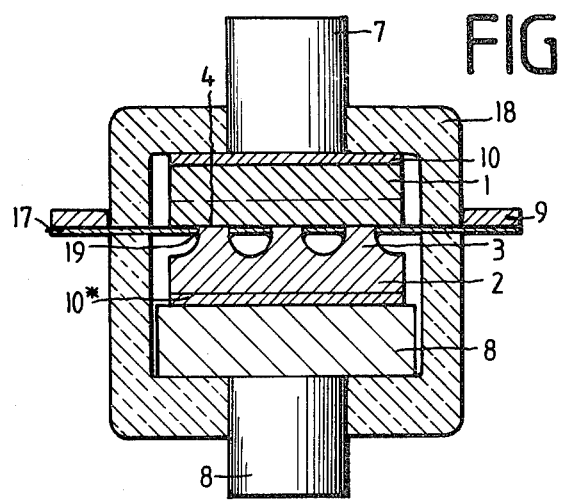
FIG. 3a is a sectional schematic view of an n-GaAs field-effect transistor with Schottky gate contacts.

In FIG. 3a, 1 and 2 are n-GaAs discs having a specific electrical resistance of 0.1 $\Omega$cm. Both discs have a structure of parallel ridges 3, tapering to a width of $2.10^{-4}$ cm, on one major side. Both discs 1 and 2 have barrier-free contacts 10 or 10* on their non-structured side. The discs 1 and 2 are placed on top of each other at a fixed pressure and with interposition of a platinum foil 17 having a thickness of $2.10^{-4}$ cm. The two discs are rotated with respect to each other in relation to the structures in the plane of the discs. The platinum foil 17 is pierced at the areas of contact 4 of the crossing ridges 3 of both discs 1 and 2 and moved aside so that each monocrystalline area of contact 4 is encircled by a small bead 19 comprising platinum, which forms a Schottky contact with the n-GaAs. The field-effect transistor is enclosed in the coaxial ceramics casing 18 in which 7 is the source electrode, 8 the drain electrode and 9 the gate electrode (having electrical contact to the platinum foil 17).

Figure 3B:
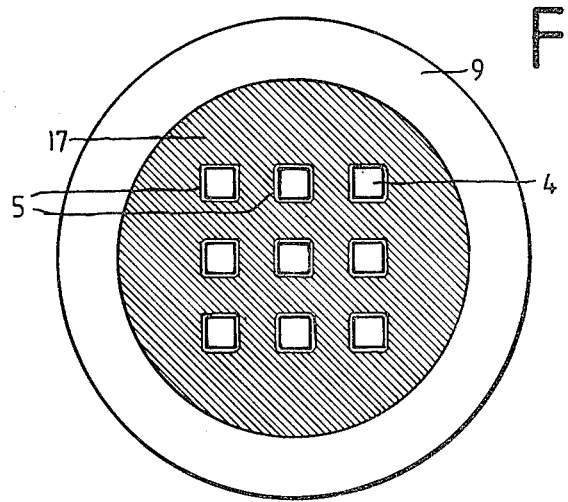

In FIG. 3b, a view of the plane of contact of both discs 1 and 2 is indicated schematically showing how the nine n-GaAs contacts 4 are encircled by the platinum foil 17 and form the areas of contact 4 surrounded by the n-GaAs Schottky field-effect contacts 5. The field-effect transistor has a resistance of approximately 100 ohms in its conductive condition. It is blocked with a gate voltage greater than 15 volts.

It will be understood that the above description of the present invention is susceptible to various modification changes and adaptations.

What is claimed is:

1. A field effect transistor comprising in combination: first and second semiconductor discs of the same type of conductivity, each of said discs having a plurality of parallel grooves formed in one major surface to define a structure of parallel ridges on each said disc; said first and second discs are oriented so that their structured surfaces face one another with said ridges of both said discs crossing and touching, and are permanently joined together at the areas of contact of said ridges to form a plurality of electrically parallelly connected monocrystalline narrow path resistors between said first and second discs; a gate means provided on said one major surface of at least one of said first and second discs for each said narrow path resistor; a non-blocking source electrode disposed on the opposite major surface of one of said first and second discs; and a non-blocking drain electrode disposed on the opposite major surface of the other of said first and second discs.

2. A field-effect transistor as defined in claim 1, wherein said semiconductor comprises a material selected from the group consisting of monocrystalline and polycrystalline single element semiconductors and compound semiconductors.

3. A field effect transistor as defined in claim 1 wherein said gate means is a pn junction gate including: an opposite conductivity type region provided in the side surfaces of said ridges of at least one of said discs and forming a pn junction with the respective said disc; and a non-blocking metal contact for each said opposite conductivity type region.

4. A field effect transistor as defined claim in 1 wherein said gate means is an MOS-gate including: a layer of insulating material covering the exposed portions of the surfaces of said ridges; and a layer of metal on said insulating layer.

5. A field effect transistor as defined in claim 1 wherein said gate means comprises a layer of metal forming a Schottky contact with at least one of said discs.

6. A field effect transistor as defined in claim 5 wherein said layer of metal comprises a metal or metalized insulator foil arranged between the structural surfaces of both said discs and surrounding said areas of contact.

7. A field effect transistor as defined in claim 1 wherein said crossing ridges are oriented at 90° relative to one another.

8. A field effect transistor as defined in claim 1 wherein said first and second discs are connected together at said areas of contact due to plastic deformation of the semiconductor lattice.

9. A field effect transistor as defined in claim 8 wherein the width of said ridges at said one major surface is from $2.10^{-4}$ to $10^{-3}$ cm.

* * * * *